(12) United States Patent
Lee et al.

(10) Patent No.: US 7,751,234 B2
(45) Date of Patent: *Jul. 6, 2010

(54) PHASE CHANGE MEMORY DEVICE AND PROGRAM METHOD THEREOF

(75) Inventors: Kwang-Jin Lee, Hwaseong-si (KR); Du-Eung Kim, Yongin-si (KR); Sang-Beom Kang, Hwaeseong-si (KR); Woo-Yeong Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/168,742

(22) Filed: Jul. 7, 2008

(65) Prior Publication Data

US 2009/0003049 A1    Jan. 1, 2009

Related U.S. Application Data

(63) Continuation of application No. 11/319,373, filed on Dec. 29, 2005, now Pat. No. 7,471,553.

(30) Foreign Application Priority Data

Sep. 16, 2005    (KR) ................ 2005-86619

(51) Int. Cl.
*G11C 11/56* (2006.01)
(52) U.S. Cl. .................. 365/163; 365/148; 365/226
(58) Field of Classification Search .............. 365/163, 365/148, 226
See application file for complete search history.

(56) References Cited

U.S. PATENT DOCUMENTS

| 6,359,947 | B1 | 3/2002 | Rao | |
|---|---|---|---|---|
| 6,567,296 | B1 | 5/2003 | Casagrande et al. | |
| 2001/0019511 | A1* | 9/2001 | Kondo et al. | 365/226 |
| 2004/0114444 | A1* | 6/2004 | Matsuoka | 365/200 |
| 2005/0185572 | A1 | 8/2005 | Resta et al. | |
| 2006/0203541 | A1 | 9/2006 | Toda | |
| 2007/0058425 | A1 | 3/2007 | Cho et al. | |

FOREIGN PATENT DOCUMENTS

| JP | 06-208798 | 7/1994 |
|---|---|---|
| JP | 06-217527 | 8/1994 |
| JP | 06-309868 | 11/1994 |
| KR | 100173934 B1 | 11/1998 |
| KR | 1020050021643 A | 3/2005 |
| WO | WO 2004/084228 A1 | 9/2004 |

* cited by examiner

*Primary Examiner*—Vu A Le
*Assistant Examiner*—Han Yang
(74) *Attorney, Agent, or Firm*—Volentine & Whitt, PLLC

(57) ABSTRACT

A phase change memory device includes a memory cell having a phase change material, a write driver adapted to supply a program current to the memory cell during a programming interval, and a pump circuit adapted to enhance a current supply capacity of the write driver during the programming interval. The pump circuit is activated prior to the programming interval in response to an external control signal.

16 Claims, 7 Drawing Sheets

PHASE CHANGE MEMORY DEVICE AND PROGRAM METHOD THEREOF

CROSS-REFERENCE TO RELATED APPLICATION

This is a Continuation of U.S. non-provisional application Ser. No. 11/319,373, the entirety of which is incorporated herein by reference.

BACKGROUND OF THE INVENTION

1. Field of the Invention

Embodiments of the present invention are related to semiconductor memory devices. In particular, embodiments of the invention are related to a phase change memory device and a program method thereof.

A claim of priority is made to Korean Patent Application No. 2005-86619, filed Sep. 16, 2005, the subject matter of which is hereby incorporated by reference in its entirety.

2. Description of the Related Art

Integrated circuit memory devices are typically classified into one of two categories. These categories include random access memory (RAM) and read only memory (ROM) devices. Random access memory devices are typically volatile memory devices that lose their data when power to the memory is interrupted. In contrast, read only memory devices are typically non-volatile memory devices that retain-their data even in the presence of power interruption. Examples of random access memory devices include dynamic RAM (DRAM) and static RAM (SRAM). Examples of non-volatile memory devices include programmable ROM (PROM), erasable programmable ROM (EPROM) and electrically erasable programmable ROM (EEPROM).

Recently, semiconductor memory devices have been introduced which utilized various non-volatile materials intended to replace the capacitive element of a conventional DRAM cell. Examples of these devices include ferroelectric RAM (FRAM) devices having ferroelectric capacitors, magnetic RAM (MRAM) devices having tunneling magneto-resistive (TMR) films, and a phase change memory (PRAM) devices having chalcogenide alloys. Among these, the phase change memory devices have garnered substantial attention due to their large memory capacity, ease of manufacture, and relatively low cost.

The phase-change random access memory (PRAM), also known as an Ovonic Unified Memory (OUM), includes a phase-change material such as a chalcogenide alloy which is responsive to heat so as to be stably transformed between crystalline and amorphous states. Such a PRAM is disclosed, for example, in U.S. Pat. Nos. 6,487,113 and 6,480,438.

The phase-change material of the PRAM exhibits a relatively low resistance in its crystalline state, and a relatively high resistance in its amorphous state. In conventional nomenclature, the low-resistance crystalline state is referred to a 'set' state and is designated logic "0", while the high-resistance amorphous state is referred to as a 'reset' state and is designated logic "1".

The terms "crystalline" and "amorphous" are relative terms in the context of phase-change materials. That is, when a phase-change memory cell is said to be in its crystalline state, one skilled in the art will understand that the phase-change material of the cell has a more well-ordered crystalline structure when compared to its amorphous state. A phase-change memory cell in its crystalline state need not be fully crystalline, and a phase-change memory cell in its amorphous state need not be fully amorphous.

Generally, the phase-change material of a PRAM is reset to an amorphous state by heating the material in excess of its melting point temperature for a relatively short period of time. On the other hand, the phase-change material is set to a crystalline state by heating the material below its melting point temperature for a longer period of time. In each case, the material is allowed to quickly cool to its original temperature after the heat treatment.

The speed and stability of the phase-change characteristics of the phase-change material are critical to the performance characteristics of the PRAM. As suggested above, chalcogenide alloys have been found to have suitable phase-change characteristics, and in particular, a compound including germanium (Ge), antimony (Sb) and tellurium (Te) (e.g., $Ge_2Sb_2Te_5$ or GST) exhibits a stable and high speed transformation between amorphous and crystalline states.

FIG. 1 is an equivalent circuit diagram of a phase change memory cell. As shown, the memory cell 10 includes a variable resistor C and a transistor M connected in series between a bit line BL and a reference potential (e.g., ground), with a gate of the transistor M being connected to a word line WL. The variable resistor C includes a phase-change material which, as described above, is programmed between crystalline and amorphous states.

The set and reset states of the memory cell 10 of FIG. 1 are established by controlling the magnitude and duration of current flow through the variable resistor C. The variable resistor C is activated (or accessed) by operation of the transistor M which is responsive to a voltage of the word line WL. When activated, the memory cell 10 is programmed according to the voltage of the bit line BL. That is, the bit line BL voltage is controlled to establish a programming current which selectively programs the variable in its 'set' and 'reset' states.

FIG. 2 illustrates an example of temperature pulse characteristics of a phase-change material as the phase-change material is programmed in the 'set' and 'reset' states. In particular, reference number 1 denotes the temperature pulse of the phase-change material programmed to its 'reset' state, and reference number 2 denotes the temperature pulse of the phase-change material programmed to its 'set' state.

As shown in FIG. 2, when the phase-change material is programmed to its 'reset' state, the temperature of the material is increased above its melting temperature Tm (e.g., 610° C.) for a relatively short period of time, and then allowed to rapidly cool. In contrast, when the phase-change material is programmed to its 'set' state, the temperature of the material is increased to below its melting point Tm and above its crystallizing temperature Tc (e.g., 450° C.) for a longer period of time, and then allowed to cool more slowly. The fast and slow cooling of the 'reset' and 'set' programming operations are referred to in the art as fast "quenching" and slow "quenching", respectively. The temperature range between the melting temperature Tm and the crystallizing temperature Tc is referred to as the "set window".

It should be noted that the phase-change memory cell 10 of FIG. 1 is presented as an example only, and that other structures may be possible. For example, the memory cell 10 may instead include the variable resistor and a diode connected in series between the bit line BL and the word line WL.

A write driver of the phase change memory device is used to provide the programming current discussed above, i.e., to provide a 'set' current or 'reset' current to the bit line of the phase change memory cell being programmed. As with other types of non-volatile memory devices, there is a general demand in the industry to reduce the operational voltages of power supply circuits contained in phase-change memory devices. However, as the supply voltage of the phase change memory device is reduced (e.g., from 2.5V to 1.8V), it become increasingly difficult for the write driver to generate sufficient write currents to reliably program the phase change memory cells into the 'set' and 'reset' states. As such, it has been suggested to use a voltage pump circuit in conjunction with the write driver in an effort to ensure adequate write currents during programming. Unfortunately, however, the conventional solutions employing a voltage pump circuit can substantially slow the overall programming operation.

SUMMARY OF THE INVENTION

According to one aspect of the present invention, a phase change memory device is provided which includes a memory cell having a phase change material, a write driver adapted to supply a program current to the memory cell during a programming interval, and a pump circuit adapted to enhance a current supply capacity of the write driver during the programming interval. The pump circuit is activated prior to the programming interval in response to an external control signal.

According to another aspect of the present invention, a method of programming a phase change memory device is provided. The phase change memory device includes a write driver which supplies a program current to a memory cell and a pump circuit which enhances a current supply capacity of the write driver. The method includes activating an auxiliary pump of the pump circuit during a pump set-up mode interval prior to a programming interval in which the write driver supplies the program current to the memory cell, and activating a main pump of the pump circuit during a pump-active mode interval which overlaps the programming interval.

BRIEF DESCRIPTION OF THE DRAWINGS

The above and other aspects and features of the present invention will become readily apparent from the detailed description that follows, with reference to the accompanying drawings, in which.

DESCRIPTION OF EXEMPLARY EMBODIMENTS

Figure 3:
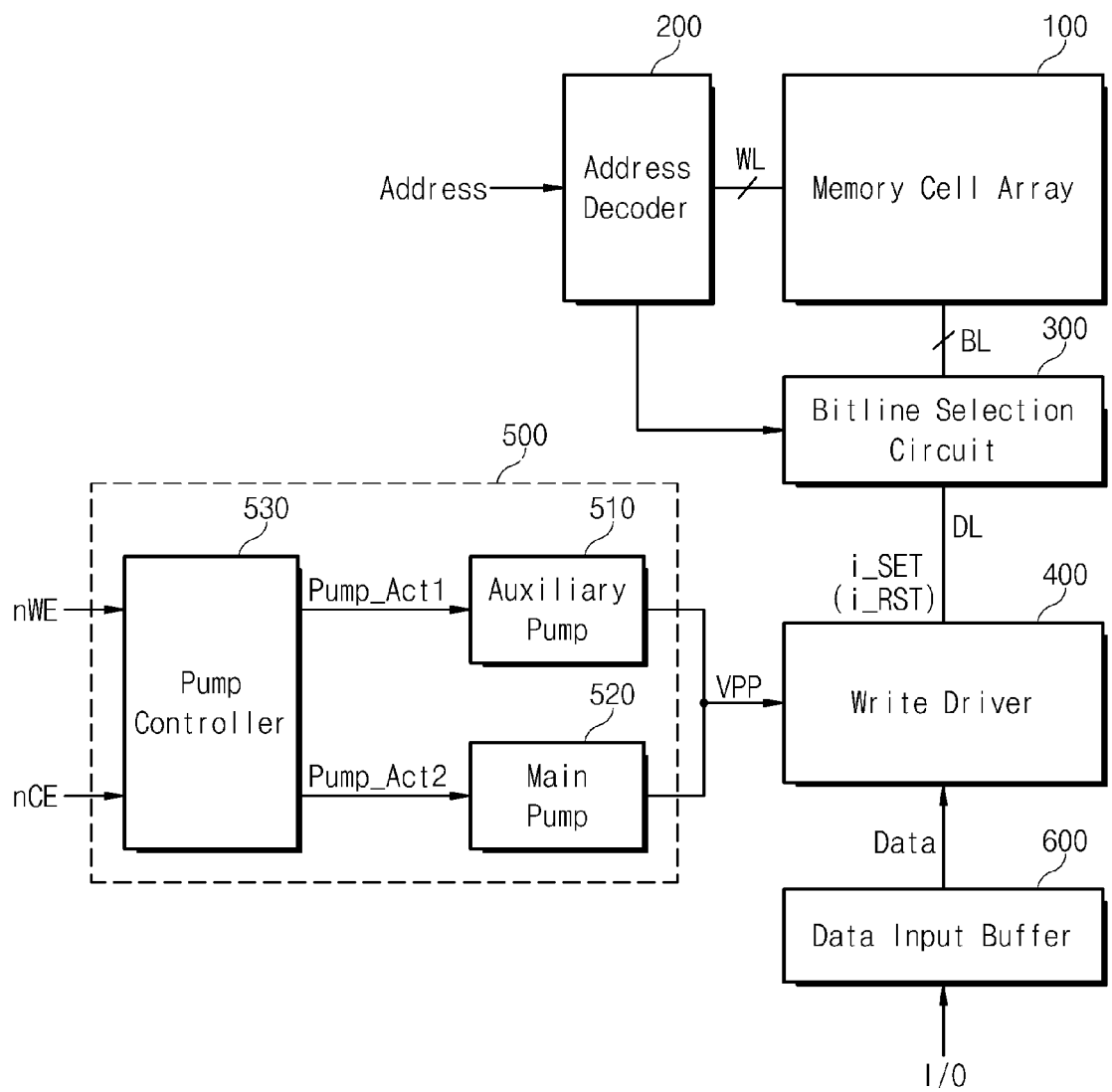
FIG. 3 is a block diagram showing a phase change memory device in accordance with an exemplary embodiment of the present invention.

FIG. 3 is a block diagram showing a phase change memory device in accordance with an exemplary embodiment of the present invention. Referring to FIG. 3, the phase change memory device includes a memory cell array 100, an address decoder 200, a bitline selection circuit 300, a write driver 400, a pump circuit 500, and a data input buffer 600.

Figure 1:
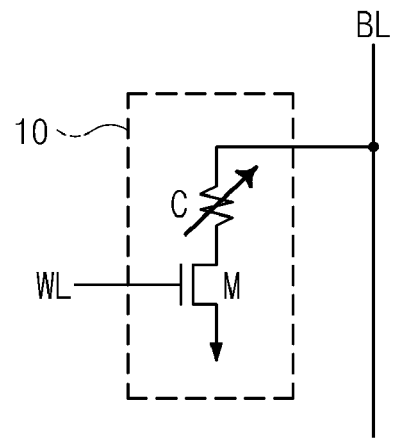
FIG. 1 is a circuit diagram of a phase change memory cell.
Figure 2:
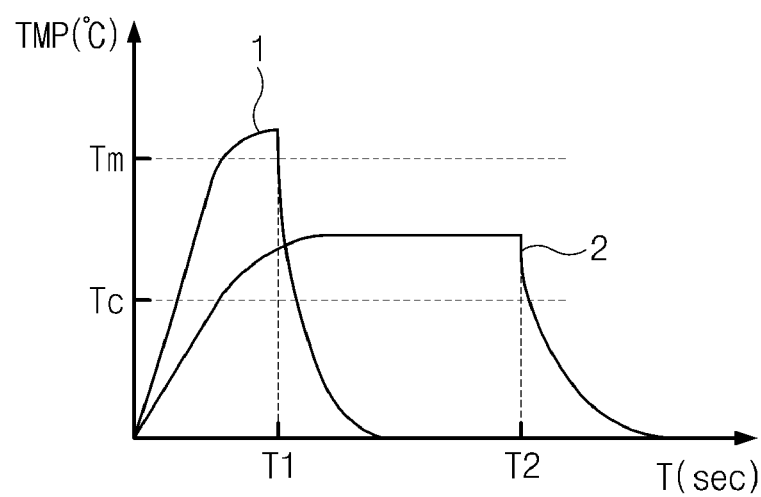
FIG. 2 is a graph illustrating temperature characteristics of phase change material during programming of a phase change memory cell.

The memory cell array 100 includes a plurality of phase change memory cells configured, for example, as shown in previously discussed FIG. 1. Each phase change memory cell of the memory cell array 100 is connected to a wordline WL and a bitline BL.

The address decoder 200 receives row and column addresses, accesses a word line WL in accordance with the row address, and outputs a bit line selection signal in accordance with the column address.

The bitline selection circuit 300 selectively connects a data line DL to a selected bitline BL in accordance with the bit line selection signal output by the address decoder 200.

The write driver 400 receives data from the data input buffer 600 during a program operation and generates a program current to be supplied to the memory cell, that is, a set current i_SET or a reset current i_RST. The write driver 400 is driven by a boosted voltage VPP which exceeds a power supply voltage (e.g., 1.8V). An example of the internal configuration and operating principles of the write driver 400 will be more fully described later with reference to FIG. 4.

Still referring to FIG. 3, the pump circuit 500 supplies the boosted voltage VPP to the write driver 400. As shown, the pump circuit 500 generally includes an auxiliary pump 510, a main pump 520, and a controller 530. The auxiliary pump 510, which is provided to reduce a pump setup time, functions as a first power source of the boosted voltage VPP and is activated both before and during a programming interval. The programming interval is a time interval in which the write driver 400 generates the write current i_SET or the write current i_RST mentioned above. The main pump 520 functions as a second power source of the boosted voltage VPP and is activated during the programming interval.

The pump controller 530 is responsive to a write enable signal nWE and a chip enable signal nCE to control activation of the main pump 520 and the auxiliary pump 510. In particular, the pump controller 530 supplies a first pump activation signal Pump_Act 1 to the auxiliary pump 510 before the start of the previously described programming interval. In addition, the pump controller 530 supplies the first pump activation signal Pump_Act 1 to the auxiliary pump 510 and a second pump activation signal Pump_Act 2 to the main pump 520 during the programming-interval. The internal construction and operating principles of the pump controller 530 will be described later by way of examples with reference to FIGS. 5 to 8.

The pump circuit 500 of the present embodiment is effective in enhancing the current supply capacity of the write driver 400. In addition, by activating the auxiliary pump 510 prior to the start of the programming interval, the overall setup time of the pump circuit 500 is reduced, thereby also reducing the programming time of the phase change memory device of FIG. 3.

Figure 4:
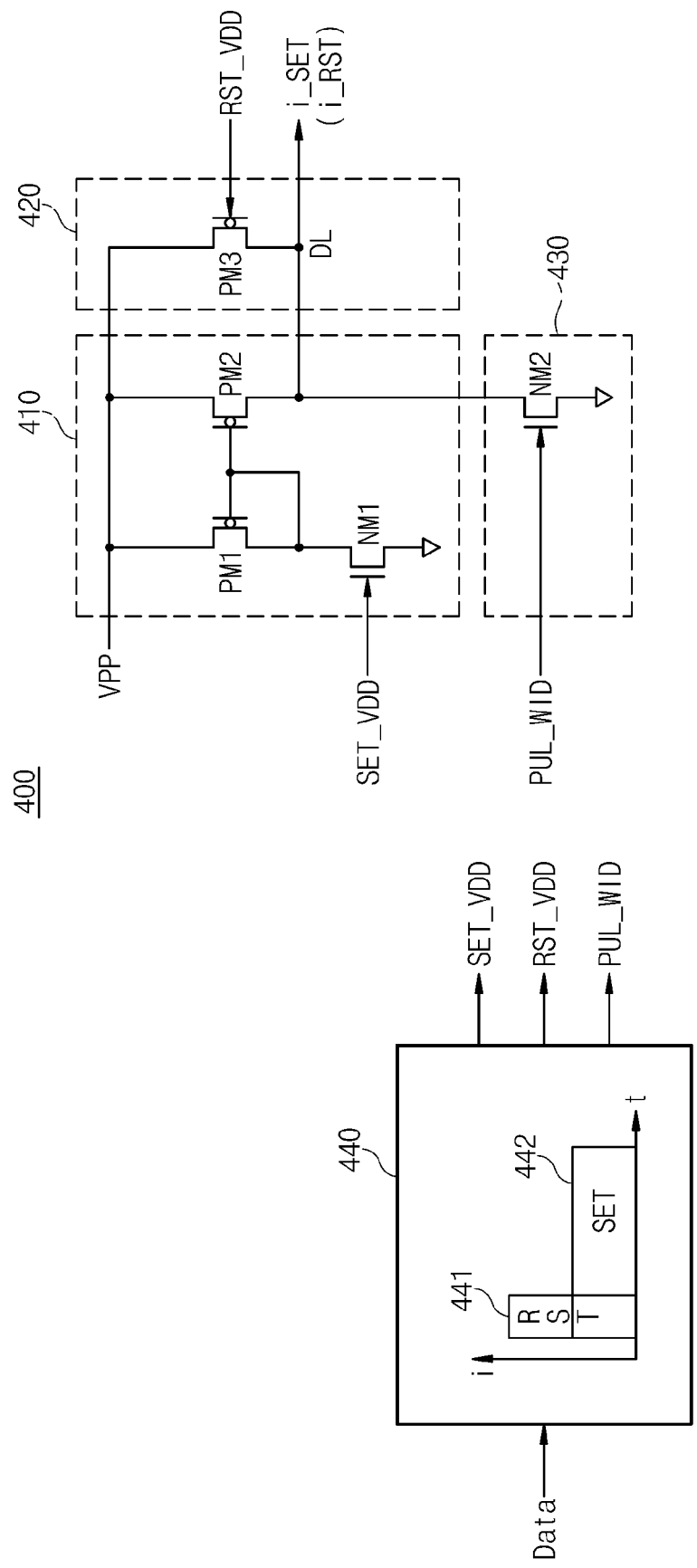
FIG. 4 is a circuit diagram showing a write driver in accordance with an exemplary embodiment of the present invention.

Reference is now made to FIG. 4 which is a circuit diagram of an example of the write driver 400 of FIG. 3. The write driver 400, which is driven by the boosted voltage VPP, includes a set current generating circuit 410, a reset current generating circuit 420, a pulse width controlling circuit 430, and a write driver controller 440.

The set current generating circuit 410 receives the boosted voltage VPP (from the pump circuit 500 of FIG. 3), and generates a set current pulse i_SET on a data line DL in accordance with control signal SET_VDD. In particular, PMOS transistors PM1 and PM2 form a current mirror. When the control signal SET_VDD is HIGH, the NMOS transistor NM1 becomes conductive and current is drawn through one side of the current mirror. This current is thus reflected as the set current i_SET on the other side of the current mirror connected to the data line DL.

The reset current generating circuit 420 also receives a high voltage VPP and provides a reset current i_RST to the data line DL in response to a reset control signal RST_VDD. In particular, the reset current i_RST is applied when the reset control signal RST_VDD is LOW, thus placing the PMOS transistor PM3 in an ON state. It is noted that the reset current i_RST may be formed by the combination of the set current i_SET and the current derived from placing the PMOS transistor PM3 in an ON state.

The pulse width of each of the set current i_SET and the reset current i_RST is controlled by the pulse width controlling circuit 430. That is, the data line DL is driven to ground when the pulse width control signal PUL_WID is HIGH, i.e., when the NMOS transistor NM2 is ON. Accordingly, the pulse widths of the set current i_SET and the reset current i_RST are defined by intervals in which the pulse width control signal PUL_WID is LOW, i.e., when the NMOS transistor NM2 is OFF.

The write driver controller 440 receives data from the data input buffer 600 (FIG. 3) and, depending on the logic state of the data, generates the set voltage control signal SET_VDD, the reset voltage control signal RST_VDD, and the pulse width control signal PUL_VDD. That is, if the write driver controller 440 receives data of a logic state "1", the set voltage control signal SET_VDD, the reset voltage control signal RST_VDD, and the pulse width control signal PUL_VDD are generated such that the reset current 441 generally illustrated in FIG. 4 is output at the data line DL. On the other hand, if the write driver controller 440 receives data of a logic state "0", the set voltage control signal SET_VDD, the reset voltage control signal RST_VDD, and the pulse width control signal PUL_VDD are generated such that the set current 442 generally illustrated in FIG. 4 is output at the data line DL.

Figure 5:
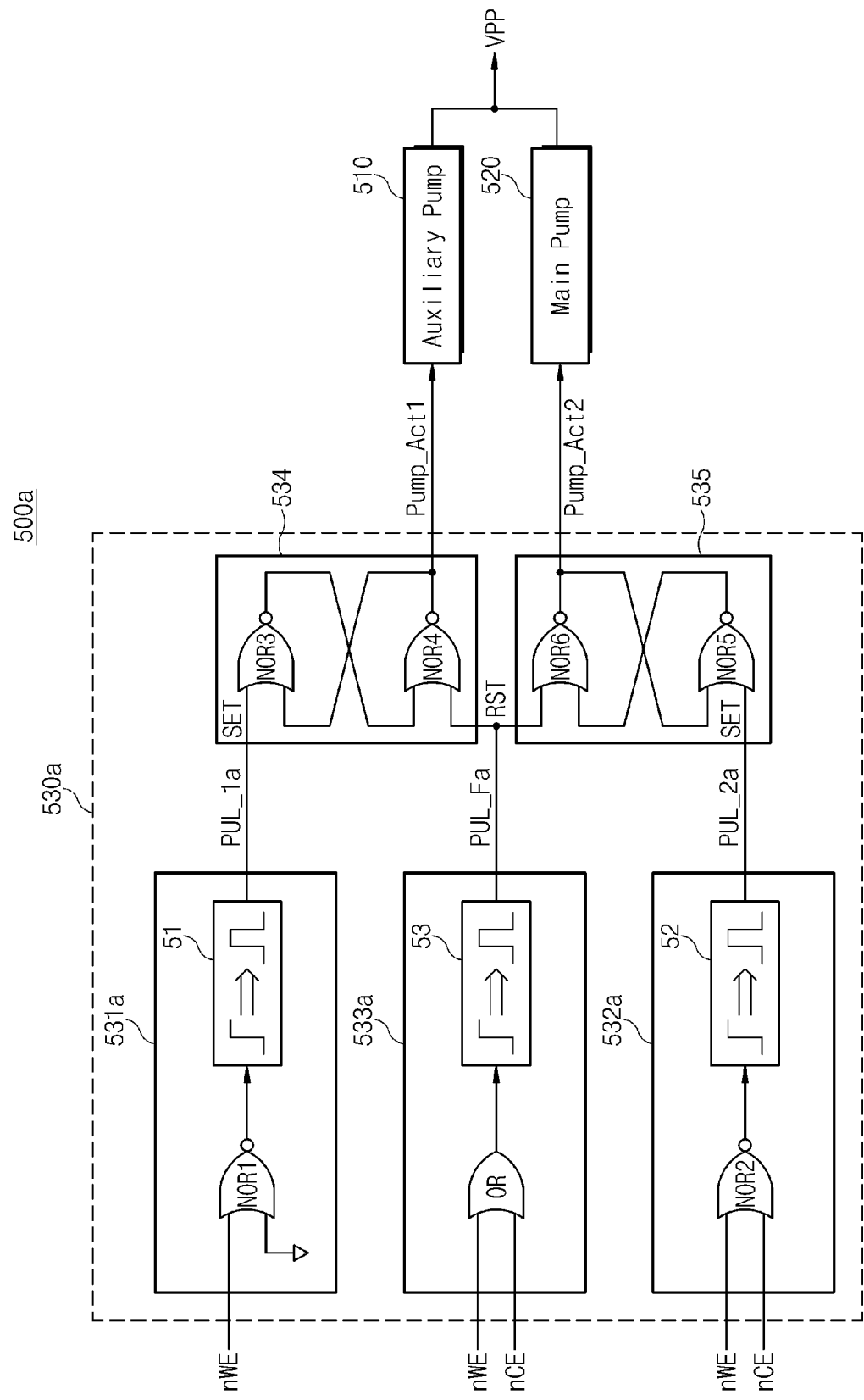
FIG. 5 is a circuit diagram of a pump circuit in accordance with an exemplary embodiment of the present invention.

FIG. 5 is a circuit diagram showing an exemplary embodiment 500a of the pump circuit 500 shown in FIG. 3. Referring to FIG. 5 the pump circuit 500a of this example includes an auxiliary pump 510, a main pump 520, and a pump controller 530a. The auxiliary pump 510 is activated in response to a first pump activation signal Pump_Act 1 to output a boosted voltage VPP, and the main pump 520 is activated in response to a second pump activation signal Pump_Act 2 to output the boosted voltage VPP. As described previously, the boosted voltage VPP is used to drive the write driver 400 of the phase change memory device of FIG. 3.

The pump controller 530a includes a first pulse generating circuit 531a, a second pulse generating circuit 632a, a third pulse generating circuit 533a, a first latch circuit 534, and a second latch circuit 535.

The first pulse generating circuit 531a includes a first NOR gate NOR1 and a first pulse generator 51. One input of the NOR gate NOR1 is connected to a ground terminal, while the other input receives the write enable signal nWE. The first pulse generating circuit 531a generates a first pulse signal PUL_1a in response to the write enable signal nWE.

The second pulse generating circuit 532a includes a second NOR gate NOR2 and a second pulse generator 52. One input of the NOR gate NOR2 receives the write enable signal nWE, while the other input receives the chip enable signal nCE. The second pulse generating circuit 532a generates a second pulse signal PUL_2a in response to the write enable signal nWE and the chip enable signal nCE.

The third pulse generating circuit 533a includes an OR gate OR and a third pulse generator 53. One input of the OR gate OR receives the write enable signal nWE, while the other input receives the chip enable signal nCE. The third pulse generating circuit 533a generates a third pulse signal PUL_Fa in response to the write enable signal nWE and the chip enable signal nCE.

The first latch circuit 534 includes third and fourth NOR gates NOR3 and NOR4. The first latch circuit 534 is responsive to the first pulse signal PUL_1a to enable the first pump activation signal Pump_Act1, and is responsive to the third pulse signal PUL_Fa to disable the first pump activation signal Pump_Act1.

The second latch circuit 535 includes fifth and sixth NOR gates NOR5 and NOR6. The second latch circuit 535 is responsive to the second pulse signal PUL_2a to enable the second pump activation signal Pump_Act 2, and is responsive to the third pulse signal PUL_Fa to disable the second pump activation signal Pump_Act2.

Figure 6:
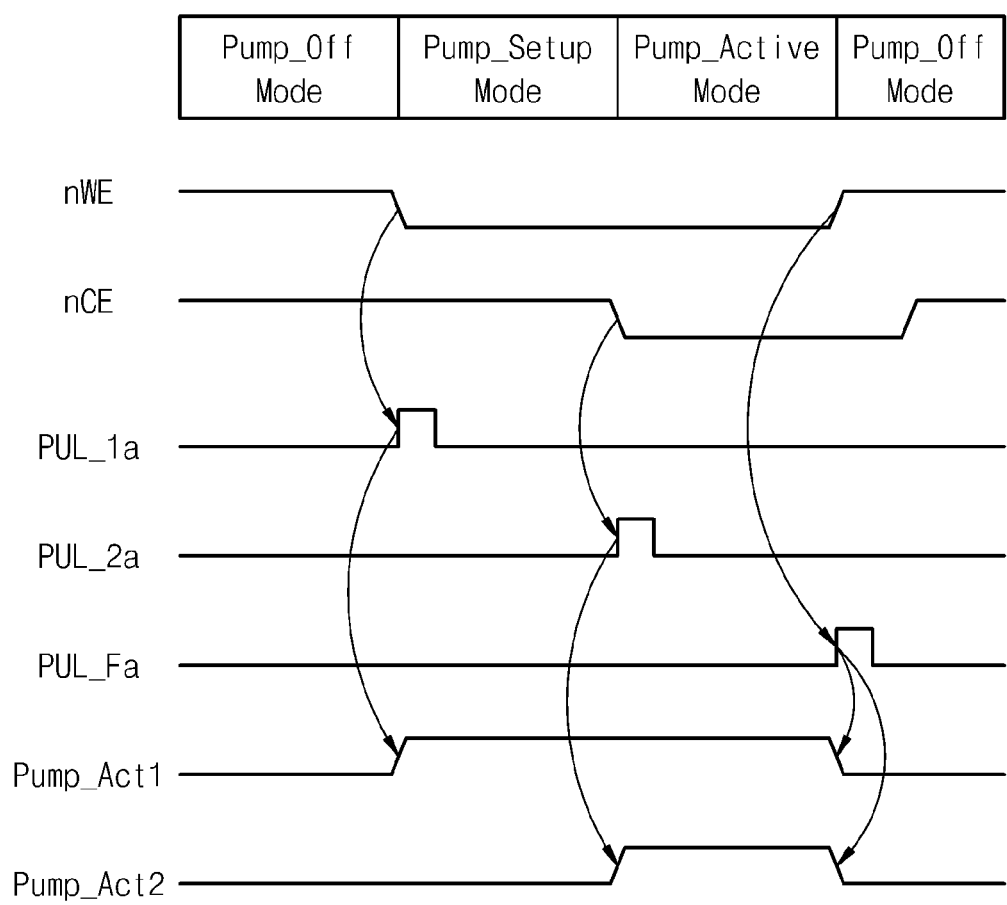
FIG. 6 is a timing diagram illustrating an operation of the pump circuit of FIG. 5.

FIG. 6 is a timing diagram illustrating an exemplary operation of the pump circuit of FIG. 5.

In a Pump_Off Mode; the write-enable signal nWE and the chip enable signal nCE are both HIGH. In this state, no pulses are applied to the first and second latch circuits 534 and 535, and the first and second pump activation signals Pump_Act1 and Pump_Act2 are disabled.

Next, in a Pump-Setup Mode, the write enable signal nWE goes LOW, causing the first pulse generating circuit 531a to apply the first pulse signal PUL_1a to the first latch circuit 534. As such, the first pump activation signal Pump_Act1 is enabled to activate the auxiliary pump 510.

Then, in a Pump_Active Mode, the chip enable signal nCE goes LOW, causing the second pulse generating circuit 532a to apply the second pulse signal PUL_2a to the second latch circuit 535. As such, the second pump activation signal Pump_Act2 is enabled to activate the main pump 520.

Finally, in a second Pump_Off mode, the write enable signal nWE returns to HIGH, causing the third pulse generating circuit 533a to apply the third pulse signal PUL_Fa to the first and second latch circuits 534 and 535. As such, the first and second pump activation signals Pump_Act1 and Pump_Act2 are disabled, thus deactivating the Auxiliary Pump 510 and the Main Pump 520. Sometime thereafter, the chip enable signal nCE returns to HIGH.

In the operation described above in connection with FIG. 6, the Pump_Setup Mode is executed in an interval preceding a programming interval of the phase change memory cell array 100 (FIG. 3). The Pump_Active Mode is executed during the programming interval of the phase change memory cell array 100. By activating the auxiliary pump 510 in the Pump_Setup Mode prior to the start of the programming interval, the overall setup time of the pump circuit 500a is reduced, thereby also reducing the programming time of the phase change memory device of FIG. 3: In addition, by activating only the auxiliary pump 510 in the Pump_Setup Mode, power consumption is minimized.

Figure 7:
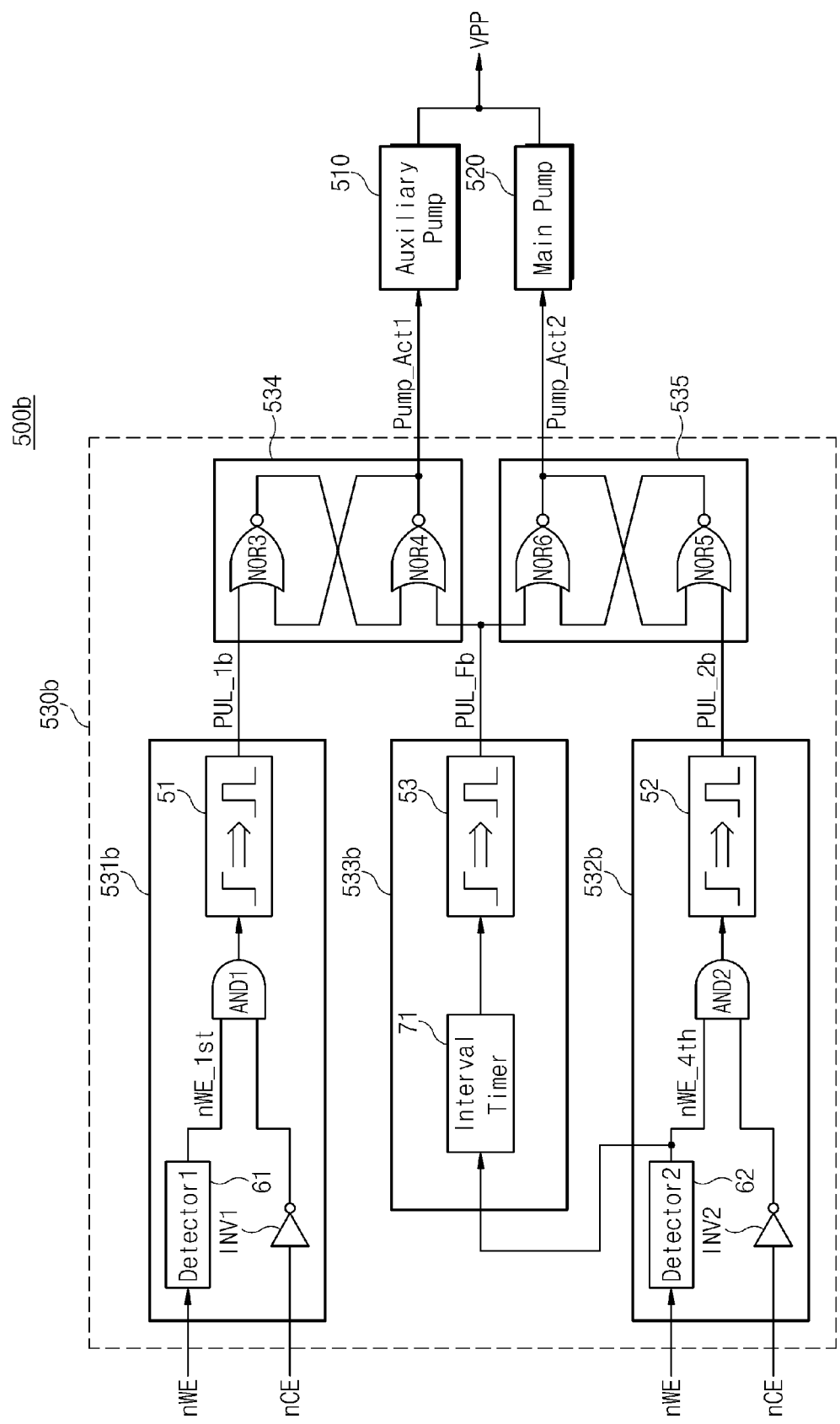
FIG. 7 is a circuit diagram of a pump circuit in accordance with another exemplary embodiment of the present invention.

FIG. 7 is a circuit diagram showing another embodiment 530b of the pump circuit 500 of FIG. 3. Referring to FIG. 7, the pump circuit 500b of this example includes an auxiliary pump 510, a main pump 520, and a pump controller 530b. The auxiliary pump 510 is activated in response to a first pump activation signal Pump_Act 1 to output a boosted voltage VPP, and the main pump 520 is activated in response to a second pump activation signal Pump_Act 2 to output the boosted voltage VPP. As described previously, the boosted voltage VPP is used to drive the write driver 400 of the phase change memory device of FIG. 3.

The pump controller 530b includes a first pulse generating circuit 531b, a second pulse generating circuit 532b, a third pulse generating circuit 533b, a first latch circuit 534, and a second latch circuit 535.

The first and second latch circuits 534 and 535 operate in the same manner as the like-numbered latch circuits of FIG. 5. Accordingly, a detailed description of the first and second latch circuits 534 and 535 of FIG. 7 is omitted here to avoid redundancy.

The first pulse generating circuit 531b includes a first detector 61, a first inverter INV1, a first AND gate AND1, and a first pulse generator 51. The first detector 61 receives the write enable signal nWE, the first inverter INV1 receives the chip enable signal nCE, the first AND gate AND1 receives the outputs from the first detector 61 (nWE_1st) and the first inverter INV1, and the first pulse generator 51 receives the output from the first AND gate AND1. The first pulse generating circuit 531b generates a first pulse signal PUL_1b in response to the write enable signal nWE and the chip enable signal nCE.

The second pulse generating circuit 532b includes a second detector 62, a second inverter INV2, a second AND gate AND2, and a second pulse generator 52. The second detector 62 receives the write enable signal nWE, the second inverter INV2 receives the chip enable signal nCE, the second AND gate AND2 receives the outputs from the second detector 62 (nWE_4th) and the second inverter INV2, and the second pulse generator 52 receives the output from the second AND gate AND2. The second pulse generating circuit 532b generates a second pulse signal PUL_2b in response to the write enable signal nWE and the chip enable signal nCE. The third pulse generating circuit 533b includes an interval timer 71 and a third pulse generator 53. The interval timer 71 receives the output from the second detector 62 (nWE_4th), and the third pulse generator 53 receives the output from the interval timer 71. The third pulse generating circuit 533b generates a third pulse signal PUL_Fb in response to the write enable signal nWE.

Figure 8:
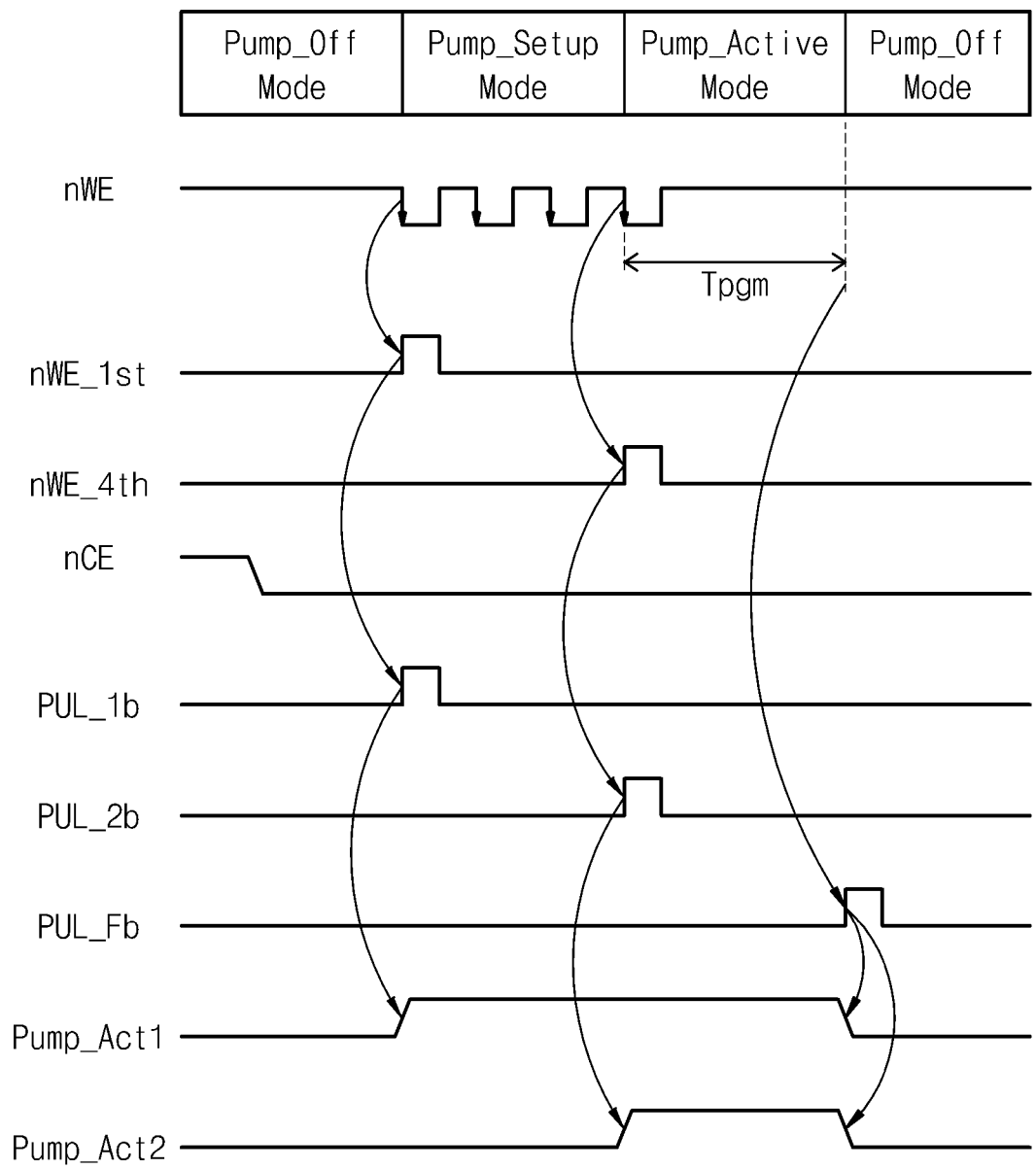
FIG. 8 is timing diagram illustrating an operation of the pump circuit of FIG. 7.

FIG. 8 is a timing diagram illustrating an exemplary operation of the pump circuit 500b of FIG. 7.

In a Pump_Off Mode, the write enable signal nWE and the chip enable signal nCE are both initially HIGH, and then the chip enable signal nCE drops to LOW. In this state, no pulses are applied to the first and second latch circuits 534 and 535, and the first and second pump activation signals Pump_Act1 and Pump_Act2 are disabled.

Next, in the Pump_Setup mode, the write enable signal nWE is toggled, the first detector 61 detects an i-th transition (in this example, i equals 1) of the write enable signal nWE (nWE_1st), causing the first pulse generating circuit 531b to apply the first pulse signal PUL_1b to the first latch circuit 534. As such, the first pump activation signal Pump_Act1 is enabled to activate the auxiliary pump 510.

Then, in the Pump_Active Mode, the second detector 62 detects the j-th transition (in this example, j equals 4) of the write enable signal nWE (nWE_4th), causing the second pulse generating circuit 532b to apply the second pulse signal PUL_2b to the second latch circuit 535. As such, the second pump activation signal Pump_Act2 is enabled to activate the main pump 520. In addition, the internal timer 71 is activated in response to the detection of the j-th transition of the write enable signal nWE (nWE_4th).

When activated, the interval timer 71 measures a pre-set time interval Tpgm. When the time interval Tpgm has elapsed after detection of the j-th transition of the write enable signal nWE (nWE_4th), the third pulse generating circuit 533b applies the third pulse signal PUL_Fb to the first and second latch circuits 534 and 535. The first and second pump activation signals Pump_Act1 and Pump_Act2 are disabled, thus deactivating the Auxiliary Pump 510 and the Main Pump 520 to reenter the Pump_Off Mode.

In accordance with the present invention, since the auxiliary pump is operated previously before programming, a program speed can be increased in programming. Additionally, in the Pump_Setup mode, the main pump is not operated, and only auxiliary pump is operated. As a result, power consumption can be minimized.

In the operation described above in connection with FIG. 8, the Pump_Setup Mode is executed in an interval preceding a programming interval of the phase change memory cell array 100 (FIG. 3). The Pump_Active Mode is executed during the programming interval of the phase change memory cell array 100. By activating the auxiliary pump 510 in the Pump_Setup Mode prior to the start of the programming interval, the overall setup time of the pump circuit 500b is reduced, thereby also reducing the programming time of the phase change memory device of FIG. 3. In addition, by activating only the auxiliary pump 510 in the Pump_Setup Mode, power consumption is minimized.

The invention has been described using exemplary embodiments; however, it will be understood that the scope of the invention is not limited to only the disclosed embodiments. Rather, the scope of the invention is intended to encompass various modifications and similar arrangements. The scope of the claims, therefore, should be accorded the broadest interpretation so as to encompass all such modifications and similar arrangements.

What is claimed is:

1. A variable resistive memory device comprising:
a memory cell;
a write driver adapted to supply a program current to the memory cell during a programming interval; and
a pump circuit adapted to enhance a current supply capacity of the write driver during the programming interval,
wherein the pump circuit is activated prior to the programming interval in response to an external control signal, and
wherein the pump circuit comprises:
an auxiliary pump which is activated prior to the programming interval;
a main pump which is activated during the programming interval; and
a pump controller adapted to control activation of the auxiliary pump and the main pump in response to the external control signal.

2. The variable resistive memory device of claim 1, wherein both the auxiliary pump and the main pump are activated during the programming interval.

3. The variable resistive memory device of claim 1, wherein the external control signal comprises a write enable signal and a chip enable signal.

4. The variable resistive memory device of claim 3, wherein the pump controller activates the auxiliary pump in response to enablement of the write enable signal, and activates the main pump in response to enablement of the chip enable signal.

5. The variable resistive memory device of claim 4, wherein the pump controller deactivates the auxiliary pump and the main pump in response to disablement of the write enable signal.

6. The variable resistive memory device of claim 4, wherein the pump controller comprises:

a first pulse generating circuit adapted to generate a first pulse signal in response to enablement of the write enable signal;

a second pulse generating circuit adapted to generate a second pulse signal in response to enablement of the chip enable signal;

a first latch circuit adapted to activate the auxiliary pump in response to the first pulse signal; and a second latch circuit adapted to activate the main pump in response to the second pulse signal.

7. The variable resistive memory device of claim 1, wherein the programming interval starts when the write driver is controlled to supply the program current.

8. A method of programming a variable resistive memory device, the variable resistive memory device comprising a write driver which supplies a program current to a memory cell and a pump circuit which enhances a current supply capacity of the write driver, said method comprising:

activating an auxiliary pump of the pump circuit during a pump set-up mode interval prior to a programming interval in which the write driver supplies the program current to the memory cell; and activating a main pump of the pump circuit during a pump-active mode interval which overlaps the programming interval in response to an external control signal.

9. The program method of claim 8, wherein the auxiliary pump and the main pump are both activated during the pump-active mode.

10. The program method of claim 8, wherein the external signal comprises a write enable signal and a chip enable signal applied to the variable resistive memory device.

11. The program method of claim 10, wherein the auxiliary pump is activated when the write enable signal is enabled, and wherein the main pump is activated when the chip enable signal is enabled.

12. The program method of claim 11, further comprising, after the pump-active mode, deactivating the main pump and the auxiliary pump in response to disablement of the write enablement signal.

13. The program method of claim 8, wherein the programming interval starts when the write driver is controlled to supply the program current.

14. A method of programming a variable resistive memory comprising:

activating a pump circuit to supply a current prior to a program interval;

controlling the pump circuit to enhance the current supply during the program interval; and providing the enhanced current supply to a memory cell during the program interval, wherein the activating pump circuit comprises activating an auxiliary pump of the pump circuit.

15. The method claim 14, wherein the controlling pump circuit comprises activating a main pump of the pump circuit.

16. The method of claim 14, further comprising deactivating the pump circuit after the program interval.

* * * * *